United States Patent [19]

Ernyei

[11] 4,327,341
[45] Apr. 27, 1982

[54] ELECTROMECHANICAL FILTER CELLS

[75] Inventor: Herbert Ernyei, Conflans-Sainte-Honorine, France

[73] Assignee: Lignes Telegraphiques et Telephoniques, Conflans-Sainte-Honorine, France

[21] Appl. No.: 167,702

[22] Filed: Jul. 11, 1980

[30] Foreign Application Priority Data

Jul. 13, 1979 [FR] France ................... 79 18221

[51] Int. Cl.³ .................. H03H 9/50; H03H 9/00
[52] U.S. Cl. ....................... 333/197; 333/186
[58] Field of Search ............ 333/186, 197–201

[56] References Cited

U.S. PATENT DOCUMENTS 4,163,960 8/1979 Ernyei et al. ........... 333/197 X
4,197,516 4/1980 Ernyei et al. ........... 333/197 X Primary Examiner—Marvin L. Nussbaum

[57] ABSTRACT

Each cell includes two longitudinally vibrating cylindrical resonators and a flexurally vibrating coupler connected between the two resonators. The diameter of the coupler is defined by the expression:

$$d_c = \sqrt[3]{d_r^2 \cdot \frac{16}{3\pi} \cdot l_c \cdot \frac{\tan\alpha_r^+ (1 - \cos\alpha_c^+ \cosh\alpha_c^+)}{\sqrt{\Omega^+}\,[\sin\alpha_c^+ \sinh\alpha_c^+ + \cos\alpha_c^+ \cosh\alpha_c^+ \pm (\sin\alpha_c^+ + \sinh\alpha_c^+)]}}$$

wherein:
$d_r$ is the diameter of the resonators
$l_c$ is the length of the coupler
$\Omega^+ = f^+/f_o$ is the upper relative of the band of frequencies to be transmitted, $f^+$ the uper frequency of said band and $f_o$ the tuning frequency of the resonators $$\alpha_c^+ = \frac{3\pi}{4} \sqrt{\Omega^+} \cdot \frac{l_c}{l_o}$$

with $l_o$ the length of the coupler corresponding to a quarter wave effect $$d_r^+ = 2\pi n_r m \Omega^+$$

where m is the order of the vibration mode of the resonators and $n_r = l_r/\lambda_o$ with $l_r$ the length of the resonators and $\lambda_o$ the wavelength at the tuning frequency of the resonators in longitudinal vibration.

1 Claim, 5 Drawing Figures

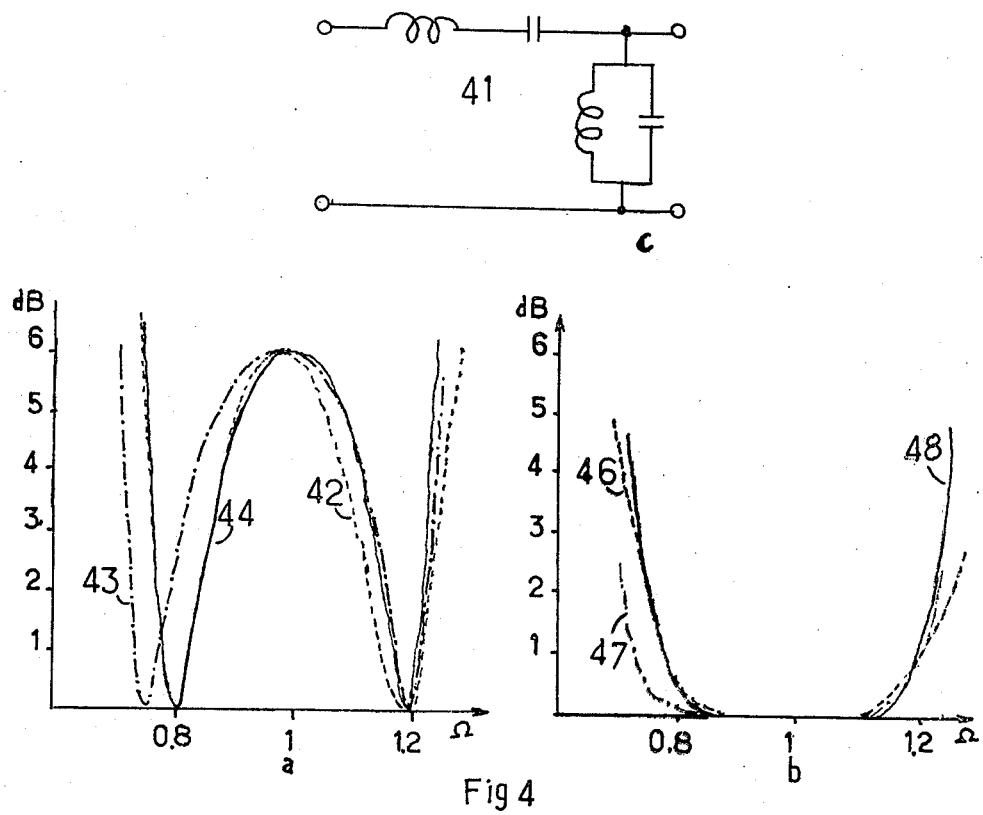
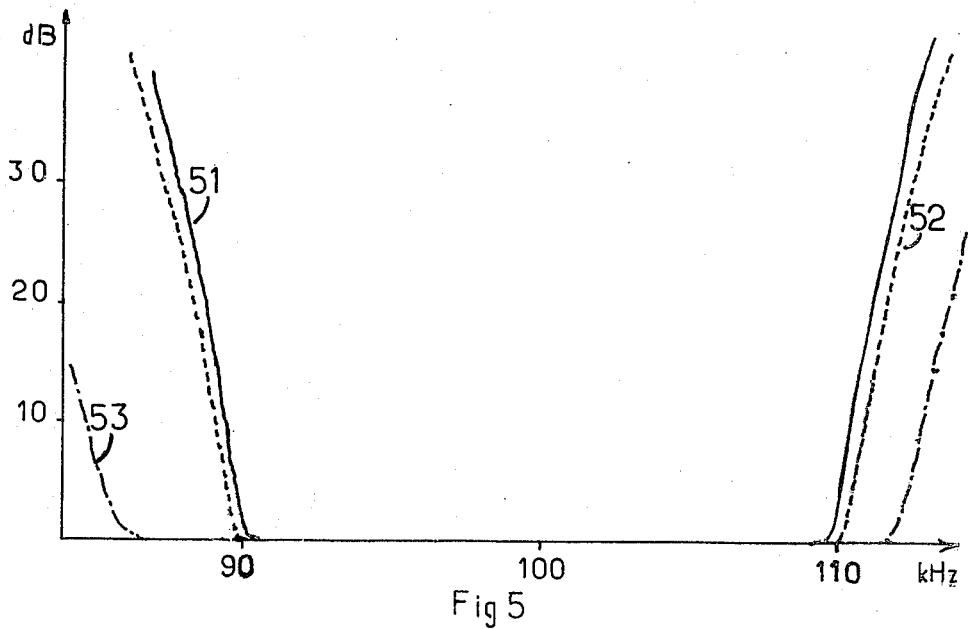
Fig 4
Fig 5

ELECTROMECHANICAL FILTER CELLS

BACKGROUND OF THE INVENTION

The present invention relates to electromechanical band-pass filters, i.e. filters whose resonant elements are cylindrical metal bars (resonators) interconnected by coupling members (couplers) vibrating in accordance with a selected mode and optionally having bridges over one or more resonators, and associated with electromechanical transducers. More particularly, the present invention concerns filters whose resonators vibrate longitudinally and couplers vibrate flexurally. Such filters are described in U.S. Pat. Nos. 4,163,960 for "Electromechanical filter structure" and 4,197,516 for "Bridged electromechanical filters", both assigned to the same Assignee as the present application.

The present invention has essentially for its object elemental cells of a filter whose band-pass reproduces with a high precision a value fixed beforehand, as well as to a filter obtained by arranging such cells in cascade. In practice, the problems for the filter manufacturer is to produce the most economic and often the most compact filter, whose transfer characteristic corresponds best to a given model. For this purpose, the manufacturer has the well known results of theoretical studies available to him and these mainly relate to electric filters and constitute the theory of filters. The results of the study of electric filters are then transposed to the mechanical field by applying an equivalent system between electrical and mechanical magnitudes well known in the art. Without going into detail on the theory of filters it is useful to point out the meaning of certain terms used hereinafter. The theory of filters reduces the study of the desired type filter (e.g. polynomial band pass) to that of a low-pass filter or so-called prototype filter. The basic electric cells forming the desired filter are obtained from a prototype filter by a simple mathematical conversion (corresponding to a change of the variable linked with the frequency). The band width of the cell forming the prototype filter is limited by the frequency beyond which the attenuation is no longer zero. By analogy, the band width of a filter cell is defined as the range of frequencies converted from the frequencies limiting the band of the prototype filter cell by the change of variable referred to hereinbefore. In the case of a complete filter obtained by arranging the cells in cascade form, said cells usually being of the same type, the response in the pass-band is defined by the type of approximation used for the design of the filter (Butterworth, Tschebycheff, etc) on the basis of the attenuation characteristic of the complete filter. The abutment for this is the model to be respected. This last condition makes it possible to define, taking account of the selected approximation type, the relationship of the impedances of the branches of the prototype filter cells and, due to the conversion of the variable, that of the cells of the desired filter. Electromechanical equivalents then make it possible to obtain characteristic magnitudes of the equivalent mechanical filter.

The article published by A. E. GUNTHER et al. in the Proceedings of the IEEE (January 1979, page 102) describes an example of a mechanical filter applied to a channel filter with a relatively broad pass band (6%) for a telephone transmission system and shows in FIG. 4 the circuit diagram of the cell of the electric filter corresponding to the mechanical filter shown in FIG. 3. Each cell of this filter has seven components. As described in this article, supplementary conditions are imposed by industrialization (identity of the bars, etc) leading to a compromise definition of the parameters of the mechanical elements. Despite the use of a relatively complex basic electric cell, the correspondence between the characterstic of the prototype filter cell and that of the produced mechanical filter cell no longer exists beyond a relative band width above the value of 6% defined in the article. This lack of correspondence results from the approximations made with a view to applying the equivalent system on a level with each of the branches of the cell. This error is unconstrained in the particular use described (relative band width of a few hundredths). However, in other cases, the difference between the real characteristic of the mechanical cell and the characteristic of the corresponding electric cell is large, making it necessary to adjust the mechanical filters produced to make them conform with the model. Such adjustments are difficult and onerous.

BRIEF SUMMARY OF THE INVENTION

The present invention relates to cells of an electromechanical filter whose band width has the desired value with a high precision. In practice, the invention makes it possible to produce even broad band width filters (relative band width of several tenths) whose band reproduces that of the corresponding electric filter with an increased precision.

More specifically, the present invention relates to an elemental cell for an electromechanical filter having a band of frequencies to be transmitted comprising two parallel cylindrical bars forming longitudinally vibrating resonators and a flexurally vibrating cylindrical coupler connected between the two resonators, wherein the diameter ($d_c$) of the coupler is defined by the formula:

$$d_c = \sqrt[3]{d_r^2 \cdot \frac{16}{3\pi} \cdot l_c \cdot \frac{\tan\alpha_r^+ (1 - \cos\alpha_c^+ \cosh\alpha_c^+)}{\sqrt{\Omega^+} \ [\sin\alpha_c^+ \sinh\alpha_c^+ + \cos\alpha_c^+ \cosh\alpha_c^+ \pm (\sin\alpha_c^+ + \sinh\alpha_c^+)]}} \quad (1)$$

where $d_r$ is the diameter of the resonators, $l_c$ the length of the coupler, $\Omega^+ = f^+/f_o$ the relative frequency of the band of frequencies to be transmitted, $f^+$ the upper frequency of said band and $f_o$ the tuning frequency of the resonators.

$$\alpha_c^+ = \frac{3\pi}{4} \sqrt{\Omega^+} \cdot \frac{l_c}{l_o}$$

with $l_o$ the length of the coupler corresponding to a quarter wave effect, $\alpha_r^+ = 2\pi n_r \, m\Omega^+$ where m is the order of the vibration mode of the resonators and where $n_r = l_r/\lambda_o$ with $l_r$ the length of the resonators and $\lambda_o$ the wavelength at the tuning frequency of the resonators in longitudinal vibration.

The most commonly used filters comprise $\lambda/4$ couplers $l_c = l_o$ and use $\lambda/2$ resonators vibrating on the fundamental mode $n_r = \frac{1}{2}$ and $m = 1$, giving $$\alpha_c^+ = \frac{3\pi}{4} \sqrt{\Omega^+}$$

and $$\alpha_r^+ = \pi \Omega^+$$

Throughout the specification and claims the suffixes 'r' and 'c' respectively refer to the 'resonator' and 'coupler'.

BRIEF DESCRIPTION OF THE DRAWINGS

The invention is described in greater detail hereinafter relative to non-limitative embodiments and the attached drawings, wherein show:

FIG. 4—transfer characteristics of a filter cell according to the invention charged by different impedances;

FIG. 5—transmission characteristics of an eight-cell filter according to the invention.

DETAILED DESCRIPTION OF THE PREFERRED EMBODIMENTS

Figure 1:
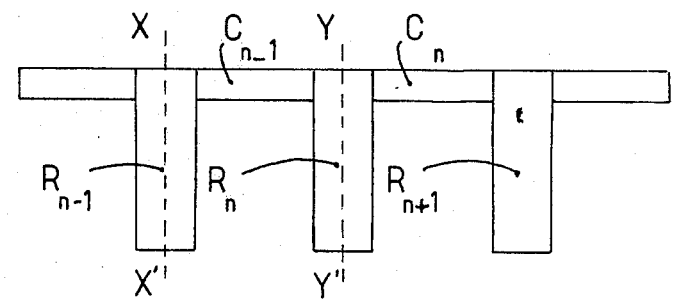
FIGS. 1 and 2—definitions of magnitudes used hereinafter.

FIG. 1 makes it possible to define what will subsequently be called an elemental cell. It diagrammatically shows three intermediate resonators of a filter $R_{n-1}$, $R_n$ and $R_{n+1}$ respectively coupled by couplers $C_{n-1}$ and $C_n$. The elemental cell of rank n constituted by half of the resonator $R_{n-1}$, the coupler $C_{n-1}$ and half of the resonator $R_n$. The cells can differ in order to obey the laws devolving from the approximation type chosen for the association of the successive cells constituting the filter (e.g. Butterworth or Tschebycheff approximation). The elemental cell is shown between the axes XX' and YY' in FIG. 1.

The coupling coefficient $X_n$ of the elemental cell of rank n is defined by the expression:

$$x_n = y_r / y_{c_{n-1}}$$

where $y_r$ is the mobility of each of the two halves of the resonator and $y_{c_{n-1}}$ is the mobility of the coupler.

Figure 2:
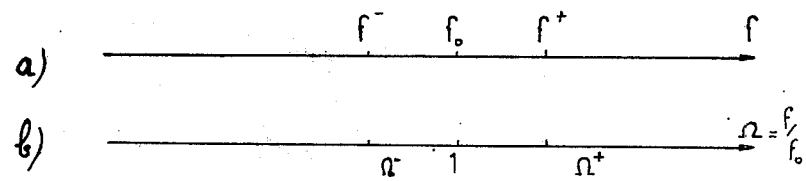

FIG. 2 shows in (a) and (b) respectively, the axis of the frequencies f and that of the relative frequencies $\Omega = f/f_o$, $f_o$ being the central frequency of the filter which must transmit the frequencies located between $f^-$ and $f^+$ and attenuate the other frequencies. These values are fixed by calculation on the basis of the theory of filters. $\Omega^+$ corresponds to the relative value of the upper limits ($f^+/f_o$) of the pass band.

Figure 3:
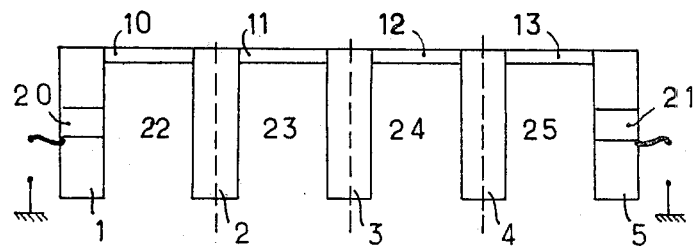
FIG. 3—a diagrammatic representation of an example of a filter according to the invention.

FIG. 3 diagrammatically shows a five-resonator filter according to the invention. At 1, 2, 3, 4 and 5 are shown the parallel cylindrical bars forming the longitudinally vibrating resonators of length $l_r$ and diameter $d_r$, interconnected by cylindrical couplers 10, 11, 12, 13 of length $l_c$ and diameter $d_c$. The electromechanical input and output transducers are shown at 20 and 21. Thus, the filter has four elemental cells separated by dotted lines, referenced respectively 22 to 25. Cells 22 and 25 are identical, as are cells 23 and 24 in the manner taught by the theory of filters.

Production is favourably influenced if the same material is used for forming the couplers and the resonators and if the couplers or resonators have the same diameters.

According to an essential feature of the invention, the couling coefficient (x) of an elemental cell obeys the condition:

$$x = \frac{1}{\sqrt{\Omega^+}} \cdot \frac{\tan\alpha_r^+ (1 - \cos\alpha_c^+ \cosh\alpha_c^+)}{[\sin\alpha_c^+ \sinh\alpha_c^+ + \cos\alpha_c^+ \cosh\alpha_c^+ \pm (\sin\alpha_c^+ + \sinh\alpha_c^+)]} \quad (2)$$

where the notations correspond to those defined for equation (1).

The sign ± of the denominator takes account of the fact that x cannot be negative no matter what the vibration mode (m).

It is also known that the coupling coefficient x of a cell for an electromechanical filter is defined by the expression:

$$x = y_{or} / y_{oc}$$

where $y_{or}$ is the characteristic mobility of the resonators and $y_{oc}$ the characteristic mobility of the coupler.

As is known, the mobility is inversely proportional to the cross-section of the corresponding element. The expressions of $y_{or}$ and $y_{oc}$ are as follows:

$$y_{or} = \frac{1}{P_r \cdot \frac{\pi d_r^2}{4} \cdot v_r}$$

where $p_r$ is the density of the material constituting the resonators and $v_r$ is the propagation velocity $$y_{oc} = \frac{1}{P_c \cdot \frac{\pi d_c^2}{4} \cdot v_c} \cdot \frac{2}{\frac{3\pi}{4} \cdot \frac{d_c}{2l_c}}$$

so that $$x = \frac{y_{or}}{y_{oc}} = \frac{P_c \cdot \frac{\pi d_c^2}{4} \cdot v_c}{P_r \cdot \frac{\pi d_r^2}{4} \cdot v_r} \cdot \frac{1}{2} \cdot \frac{3\pi}{4} \cdot \frac{d_c}{2l_c}$$

As stated hereinbefore, the couplers and resonators are made from the same material, so that $P_r = P_c$ and $v_r = v_c$.

Under these conditions, we obtain:

$$x = \frac{d_c^3}{d_r^2} \cdot \frac{3\pi}{16} \cdot \frac{1}{l_c} \quad (3)$$

The expression defined by equation (3) makes it possible to determine the diameter ($d_c$) of the couplers. Usually, the manufacturer fixes the diameter $d_r$ of the resonator so as to avoid interfering modes at frequencies near to the transmitted band. Furthermore, the length ($l_c$) of the couplers is given by the coupling condition imposed.

On the basis of equation (3), we obtain:

$$d_c = \sqrt[3]{x \cdot d_r^2 \cdot \frac{16}{3\pi} \cdot l_c} \quad (4)$$

Taking account of the expression of x given by equation (2), the diameter ($d_c$) of the couplers given by equation (4) becomes:

$$d_c = \sqrt[3]{d_r^2 \cdot \frac{16}{3\pi} \cdot l_c \cdot \frac{\tan\alpha_r^+ (1 - \cos\alpha_c^+ \cosh\alpha_c^+)}{\sqrt{\Omega^+} \; [\sin\alpha_c^+ \sinh\alpha_c^+ + \cos\alpha_c^+ \cosh\alpha_c^+ \pm (\sin\alpha_c^+ + \sinh\alpha_c^+)]}}$$

The curves of FIG. 4 illustrate the transfer characteristics of elemental cells corresponding to the electric cell shown at 41 in FIG. 4c, i.e. a single cell with two elements. Curve 4a corresponds to a cell closed on an impedance far from the critical value and curve 4b to a cell closed on an impedance which is near thereto. Curves 42 and 44 (in dotted lines) correspond to the characteristic of the cell resulting from the prototype filter, i.e. to the standard characteristic which has to be reproduced. Curves 43 and 47 (in mixed lines) illustrate the characteristic of a mechanical filter cell produced on the basis of pattern 41 by the means of the prior art. Curves 44 and 48 (solid lines) are those of the cell produced according to the invention on the basis of the same pattern of cell 41, i.e. a cell whose elements are defined by equation (1).

It can be seen that curves 44 and 48 are nearer to the standard curve (and in fact partly overlap it) than curves 43 and 47. The band width of the cell according to the invention is substantially that of the standard curve, which was not the case with the prior art cells.

FIG. 5 shows the same curves as FIG. 4 in the case of a complete eight-cell filter.

As hereinbefore, the dotted line curve 52 is that of the electric filter as defined by the theory of filters, the mixed line curve 53 that of a mechanical filter according to the prior art and the solid line curve 51 that of a filter according to the invention. The same improvements as noted in FIG. 4 are obtained. The relative pass band of the filter is 20%.

The filter comprises nine resonators constituted by identical Elinvar bars (diameter 3.5 mm, length 24 mm) vibrating longitudinally under the action of transducers constituted by diameter 2.5 mm, thickness 3 mm and length 19 mm piezoelectric ceramic elements. The resonators are coupled by couplers of the same material of identical length (1.10 mm), whose different diameters are between 1.38 and 1.42 mm. The Tschebycheff approximation is used.

At present, the construction of broad band electromechanical filters is limited by the band width of the transducers. The application of formula (1) has made it possible to test filters having a relative band width of 40% and with the same precision as the example referred to hereinbefore.

What is claimed is:

1. An elemental cell for an electromechanical filter having a band of frequencies to be transmitted, comprising:

two parallel cylindrical bars forming longitudinally vibrating resonators; and a flexurally vibrating cylindrical coupler connected between said two resonators; wherein the diameter ($d_c$) of said coupler is defined by the expression:

$$d_c = \sqrt[3]{d_r^2 \cdot \frac{16}{3\pi} \cdot l_c \cdot \frac{\tan\alpha_r^+ (1 - \cos\alpha_c^+ \cosh\alpha_c^+)}{\sqrt{\Omega^+} \; [\sin\alpha_c^+ \sinh\alpha_c^+ + \cos\alpha_c^+ \cosh\alpha_c^+ \pm (\sin\alpha_c^+ + \sinh\alpha_c^+)]}}$$

where:

$d_r$ is the diameter of said resonators $l_c$ is the length of said coupler $\Omega^+ = f^+/f_o$ is the upper relative frequency of said band of frequencies to be transmitted, $f^+$ the upper frequency of said band and $f_o$ the tuning frequency of said resonators $$\alpha_c^+ = \frac{3\pi}{4} \sqrt{\Omega^+} \cdot \frac{l_c}{l_o}$$

with $l_o$ the length of said coupler corresponding to a quarter wave effect $$\alpha_r^+ = 2\pi n_r \, m\Omega^+$$

where m is the order of the vibration mode of said resonators and $n_r = l_r/\lambda_o$ with $l_r$ the length of said resonators and $\lambda_o$ the wavelength at the tuning frequency of said resonators in longitudinal vibration.

* * * * *